United States Patent [19]
Webb

[11] Patent Number: 5,906,866
[45] Date of Patent: *May 25, 1999

[54] PROCESS FOR CHEMICAL VAPOR DEPOSITION OF TUNGSTEN ONTO A TITANIUM NITRIDE SUBSTRATE SURFACE

[75] Inventor: Douglas A. Webb, Phoenix, Ariz.

[73] Assignee: Tokyo Electron Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/797,397

[22] Filed: Feb. 10, 1997

[51] Int. Cl.$^6$ .................................................. C23C 14/02
[52] U.S. Cl. .................... 427/534; 204/192.32; 427/250; 427/255.7; 427/294; 427/309; 427/331; 427/535; 427/576; 427/585
[58] Field of Search ..................................... 427/534, 535, 427/576, 250, 255.7, 294, 309, 331; 204/192.32

[56] References Cited

U.S. PATENT DOCUMENTS

| | | | |
|---|---|---|---|
| 5,342,652 | 8/1994 | Foster ........................................ | 427/253 |
| 5,370,739 | 12/1994 | Foster et al. ............................. | 118/725 |
| 5,391,281 | 2/1995 | Hieronymi et al. ................ | 204/298.37 |
| 5,433,975 | 7/1995 | Roberts et al. .......................... | 427/253 |
| 5,434,110 | 7/1995 | Foster et al. ............................. | 437/245 |
| 5,556,521 | 9/1996 | Ghanbari ............................. | 204/192.32 |

OTHER PUBLICATIONS

Rana, V.V.S., et al. in Tungsten and Other Refractory Metals for VLSI Applications, vol. II, pp. 187–195, E. K. Broadbent ed., Materials Research Society 1987 (No month avail,).

Prasad, Jagdish, et al. in Atomic hydrogen cleaning of a TiN surface, Applied Surface Science 74 (1994), pp. 115–120, 1994 Elsevier Science B.V. (No month avail.).

*Primary Examiner*—Bernard Pianalto
*Attorney, Agent, or Firm*—Wood, Herron & Evans, L.L.P.

[57] ABSTRACT

A process for chemical vapor deposition of blanket tungsten thin films on titanium nitride proceeds by hydrogen reduction of tungsten hexafluoride at temperatures of 200 to 500° C. Tungsten film nucleation is preferably facilitated by partial removal of the oxidized surface of titanium nitride or titanium nitride coated substrates by a sputter cleaning process prior to the tungsten CVD. The process differs in part from other processes in that deposition proceeds rapidly on titanium nitride without a significant nucleation period without the addition of other chemical compounds such as silane. The sputter cleaning process preferably takes place in an inert vacuum environment that protects the substrate from atmosphere and oxygen until the tungsten CVD step occurs. The process is particularly advantageous where the substrate has a titanium nitride surface that had been created in a separate location such as by a reactive sputter coating process from which the substrate must be transferred through ambient atmosphere containing oxygen. The advantages of the invention can be partially attained or enhanced by isolating the substrates from an oxygen containing environment between the creation of the titanium nitride surface and the initiating of the tungsten CVD.

17 Claims, 3 Drawing Sheets

PROCESS FOR CHEMICAL VAPOR DEPOSITION OF TUNGSTEN ONTO A TITANIUM NITRIDE SUBSTRATE SURFACE

FIELD OF THE INVENTION

This invention relates to a process for chemical vapor deposition of tungsten films on a titanium nitride surface. More particularly, the invention relates to a process for improving nucleation in the chemical vapor deposition of tungsten films on a titanium nitride surface of a substrate, particularly where the substrate is a TiN reactive sputter coated silicon wafer or where the substrate has been exposed to air before the application of the tungsten film.

BACKGROUND OF THE INVENTION

Many studies have evaluated the chemical vapor deposition (CVD) of tungsten (W) used in semiconductor device manufacturing. One of the most common chemical schemes used in the CVD of tungsten in semiconductor device manufacture involves deposition of tungsten from tungsten hexafluoride ($WF_6$) and hydrogen ($H_2$) gases in a process referred to as the hydrogen reduction process. Typically the hydrogen reduction process involves a premixing $H_2$ and $WF_6$ gases at a sub reaction temperature in an inlet region of a reactor and then directing the gases onto the surface of a wafer to be coated, which is maintained at an elevated reaction temperature of, for example, 450° C. When the mixed gases contact the wafer at this temperature, the $WF_6$ and $H_2$ gases react to produce elemental tungsten, which is deposited onto the wafer as a film, and HF, which is exhausted from the reactor.

The initial stage of growth of the film is referred to as "nucleation", which typically involves the initial growth of metal "islands" on the substrate surface to be coated with the tungsten. When tungsten is deposited on substrate materials such as silicon and titanium-tungsten alloys, it nucleates relatively rapidly. Two major factors influencing the reactive adsorption are believed to be substrate surface composition and temperature. For deposition on substrates having surfaces of silicon, for example, nucleation of tungsten by the hydrogen reduction process occurs readily at temperatures as low as 300° C.

Deposition of tungsten on dielectric surfaces, such as titanium nitride (TiN), is more difficult when using the hydrogen reduction process. Researchers investigating deposition of tungsten on TiN have noted that for a deposition temperature of 450° C., nucleation is inhibited onto TiN surfaces as compared to deposition onto surfaces of aluminum or silicon. The same researchers investigated the initial surface of the TiN and found it to be oxidized to some extent; Rana, V. V. S., et al., *Tungsten and Other Refractory Metals for VLSI Applications*, Vol II, pages 187–195, (Materials Research Society, E. K. Broadbent, ed. 1987).

As a result of the slow deposition of tungsten onto TiN surfaces with the hydrogen reduction process, deposition of tungsten onto titanium nitride for semiconductor applications now frequently resort to a silane ($SiH_4$) reduction process. The chemistry of the silane reduction reaction provides a higher heat of reaction than does the hydrogen reduction process and better facilitates tungsten film nucleation on titanium nitride. Films deposited by the silane reduction process, however, tend to have higher sheet resistance than those deposited with the hydrogen reduction process. Accordingly, commercial processes often employ a two stage process: first, a nucleation layer is deposited with the silane reduction process, and second, a final tungsten layer is deposited over the nucleation layer with the hydrogen reduction process.

U.S. Pat. No. 5,342,652, issued to Foster et al., discloses a method where tungsten nucleation is brought about on a TiN coated substrate, which might have been exposed to atmosphere, by using particularly controlled sequences of attaining reaction pressure and temperature. Such nucleation method is also proposed for use in a cluster tool CVD module where a TiN film has been deposited by CVD in one chamber of the tool, and then, without breaking the vacuum of the apparatus or exposing TiN coated substrate to atmosphere, the TiN coated substrate is coated following nucleation by the process, either in the same chamber of the tool or another module of the tool after being transferred through a transport module, while maintaining an inert low pressure atmosphere therein, into the second CVD module in which the nucleation process is brought about and the tungsten film is applied.

While the process disclosed in U.S. Pat. No. 5,342,652 prevents an oxide layer from forming on the TiN film formed by CVD and facilitates nucleation of the deposited tungsten, it has not gained widespread acceptance in commercial applications, where the most common and preferred technology for formation of TiN layers is through physical vapor deposition or sputter coating. The vacuum requirements for physical vapor deposition of TiN differ significantly from the requirements for CVD of tungsten. Accordingly, it is difficult and expensive to combine a physical vapor deposition apparatus for forming TiN films with a CVD apparatus for forming tungsten films so that the two processes can be carried out without intervening exposure to atmosphere. Furthermore, while the process described in U.S. Pat. No. 5,342,652 improves tungsten nucleation, it has been found that greater improvement and more reliable nucleation of tungsten is desired under certain process practical conditions, such as with high concentrations of $WF_6$ and $H_2$, for example with greater than 100 Torr of $H_2$, and with wafer temperatures less than about 435° C.

Therefore, in a manufacturing environment, TiN films are typically formed on a substrate in a physical vapor deposition apparatus by sputtering a titanium metal target with reactive nitrogen gas. Formation of a tungsten layer over the sputter coated TiN film is then most efficiently achieved by removing the TiN coated substrate from the physical vapor deposition apparatus, at which time it is almost unavoidably exposed to air, and then placing the TiN coated substrate in the CVD apparatus where the tungsten film is deposited. As a result, the two step tungsten CVD process that includes a silanation step is still commonly used to maintain an acceptable tungsten nucleation and deposition rate.

It is advantageous to eliminate the requirement for the silanation step from tungsten CVD of TiN substrates for several reasons. First, the use of silane in tungsten CVD causes silicon to be incorporated into the tungsten films resulting in increased sheet resistivity of the deposited tungsten film. Second the hydrogen reduction process tends to conform less to deep recesses in integrated circuit structures. Additionally, the use of silane in a production environment can be problematic. Even a temporary leak in a silane gas line can result in a severe problem with particulate contamination. Further, silane is a hazardous substance and its presence in the manufacturing facility, where permitted by laws and regulations, is nonetheless undesirable. The substance is toxic, flammable, explosive and expensive to handle and maintain safely.

In view of the many problems associated with the two stage tungsten CVD process described above, it is advantageous to eliminate the requirement for the silane nucleation step while maintaining an acceptable tungsten nucleation and deposition rate. Additionally, due to the fact that CVD of the underlying TiN film has not gained widespread acceptance, a process is required that will allow rapid nucleation and deposition of tungsten on air exposed TiN films formed by physical vapor deposition methods.

SUMMARY OF THE INVENTION

An objective of the present invention is to provide a process for the deposition of tungsten on TiN that eliminates the need for a silane reduction step while providing rapid tungsten film nucleation at temperatures below 450° C.

It is a further objective of the present invention to provide a TiN surface that overcomes or avoids adverse effects of exposure to atmosphere when subjected to the CVD of tungsten. Such a TiN surface may be, for example, a TiN substrate or TiN coated substrate. A TiN coating, when applied, may be applied by physical vapor deposition (PVD) TiN, CVD TiN, reactively sputtered TiN, rapid thermal process TiN or plasma enhanced CVD TiN. Application by reactively sputter coating of TiN is preferred.

It is still a further objective of the present invention to provide a process for the CVD of tungsten onto TiN that economically utilizes time and equipment.

According to the principles of the present invention, a TiN surface substantially free of a nucleation inhibiting oxidized layer is produced upon introduction of the surface into the vacuum environment that is in communication with the tungsten CVD apparatus. According to one embodiment of the invention, the oxygen free surface is assured by plasma processing the TiN surface in the vacuum environment before deposition of the tungsten to remove any oxidized surface layer that may be present on the surface or to activate or otherwise condition the surface for the effective nucleation of tungsten onto the surface notwithstanding the initial presence of oxygen on the surface. Such a plasma processing step may be carried out in the chamber of the CVD reactor in which the tungsten is to be applied, or in a separate chamber, such as a sputter etch chamber, that is dedicated to the plasma treating process. Such a separate chamber may, for example, be a soft sputter etch chamber that is equipped with a higher energy plasma source than is typically practical in a CVD chamber.

According to certain embodiments of the invention, the plasma processing is a soft sputter etch performed with an argon plasma. With the argon sputter etch, the separate soft plasma etch chamber or module further allows for higher throughput from the CVD chamber.

According to further embodiments of the present invention, the plasma processing is carried out with a hydrogen plasma, or preferably with a plasma formed from a hydrogen gas. With such a hydrogen plasma, the plasma processing may be carried out in the CVD chamber prior to the deposition of the tungsten film onto the substrate. Plasma processing with hydrogen can be carried out with plasma generating equipment that employs relatively low energy, rendering it suitable for performance in a CVD chamber prior to the deposition of tungsten in that chamber. Soft sputter etching with argon usually requires somewhat higher energy equipment that occupies more space, such as magnetron plasma generators or ECR or other microwave plasma generators. Further, soft sputter etching with argon requires about a full minute of processing, which is best carried out simultaneously with the tungsten deposition on another wafer, where hydrogen plasma processing for as little as ten seconds may be effectively carried out in the CVD chamber, where longer processing would reduce the utilization of the relatively expensive CVD chamber for application of the tungsten coating.

Advantages of the present invention are that, at substrate surface temperatures below 450° C., the tungsten deposition rates, achieved on a TiN or TiN coated substrates that are substantially free of the adverse effects of an oxidized layer produced according to the present invention, are much higher than deposition rates on TiN having an untreated oxidized layer or a untreated surface that has otherwise been exposed to atmosphere. Therefore, according to the process of the present invention, tungsten films on TiN or TiN coated substrates are produced without the need for a silane reduction step to facilitate tungsten nucleation onto the TiN surface.

The preferred step of subjecting the TiN wafers to plasma processing has the additional advantage of forming a titanium rich layer on the surface, which, notwithstanding the presence or absence of oxygen, may be beneficial to the nucleation of tungsten in a hydrogen reduction reaction.

Tungsten films produced according to the present invention have a lower sheet resistance than films produced by the two step silane-nucleation tungsten-deposition process discussed above. Additionally, the process of the present invention improves net step coverage of the TiN film. Further, the process of the present invention eliminates the particulate contamination and environmental problems associated with the use of silane in the two step process.

In addition, the present invention provides these advantages without the need to combine two substantially different types of machines, the TiN sputter coating machine and the tungsten CVD machine, into a single apparatus that is linked by a common inert vacuum atmosphere, thereby allowing the production of a tungsten coated TiN wafer by the most currently efficient and desirably processes of reactive sputter deposition for the titanium nitride film and chemical vapor deposition for the overlying tungsten film.

With the present invention, the tungsten CVD process that relies on a hydrogen and tungsten hexafluoride reaction can be effectively carried out at below 500° C. to as low as 200° C., which is particularly beneficial where higher temperatures are preferably to be avoided, such as in applications where a low melting point layer, or a temperature sensitive, chemically reactive or otherwise degradable layer, is present on the wafer. Furthermore, experimentation has demonstrated that the methods described in U.S. Pat. No. 5,342,652 for improving nucleation of tungsten on TiN are substantially improved when utilizing principles of the present invention, particularly with wafer temperatures of 400° C. and below.

With the embodiment of the invention that employs the hydrogen plasma treatment, the plasma is preferably generated in the chamber of the tungsten CVD reactor immediately following the introduction of the wafer into the chamber and preceding the introduction of the $WF_6$ and initiation of the CVD reaction. With this embodiment nucleation of the tungsten proceeds without degradation even though the TiN surface may have been one that was prepared outside of the tool that contains the tungsten CVD reactor, such as in a remote reactive sputter coating apparatus, where the TiN wafers may have been exposed to oxygen containing atmosphere prior to introduction into the CVD reactor tool. This embodiment further does not require a separate sputter etching or other plasma processing module. Such an arrangement reduces the preclean processing time, particularly by elimination of substrate transfer steps, and lengthens the CVD process by as little as ten seconds or less for the hydrogen plasma treatment.

Alternatives to plasma processing for the removal of the adverse effects, particularly of oxidation, caused by exposure of the TiN to atmosphere require the prevention of the oxygen contamination. This is achieved by avoiding exposure to oxygen following the TiN application and until the introduction of the wafer having the TiN surface into the tungsten CVD reactor. This avoidance of oxygen exposure can be achieved by applying the TiN coating by a CVD process in the same tool in which the tungsten is applied. While such application of TiN can be by a CVD process, CVD application of TiN is currently a process less commonly used by users. CVD application of TiN requires temperatures that may be too high for certain layers already on the wafer to tolerate. Other reasons such as cost deter the use of CVD for TiN application. TiN is therefore preferably applied by a reactive sputter coating process preferred by users for most applications, with CVD being used where highly conformal coating is required.

Furthermore, while the integration of tungsten CVD technology and TiN reactive sputter coating technology into a single tool is an expensive combination of technologies, application of the reactive sputter coated TiN and CVD tungsten in separate machines with the transfer of the TiN coated wafers in an oxygen free environment in a cassette module to the tungsten CVD reactor is a technique that can avoid the oxygen contamination problem. However, such a transfer method is considered to be technically difficult or impractical.

These and other objectives and advantages of the present invention will be more readily understood in view of the following detailed description of the invention.

DETAILED DESCRIPTION OF THE PREFERRED EMBODIMENTS

Figure 1:
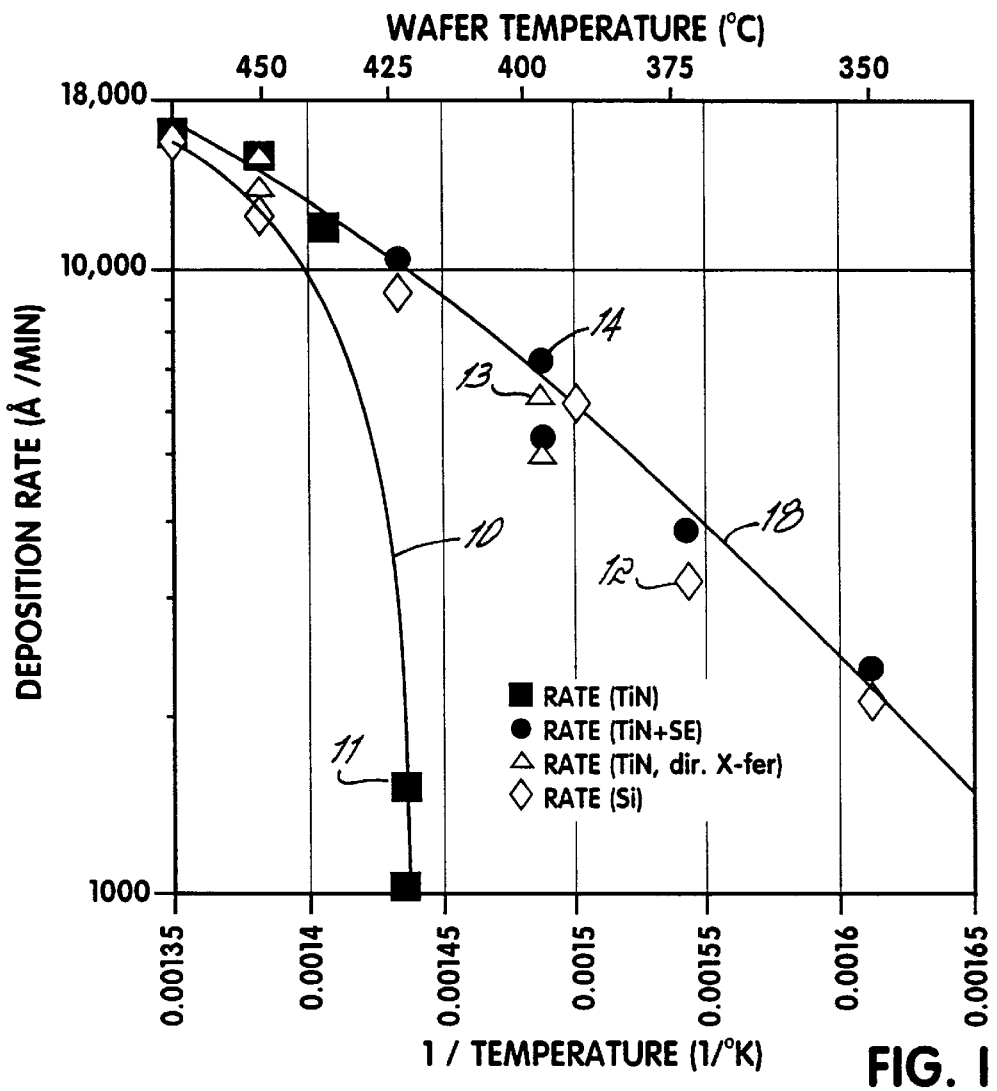
FIG. 1 is a graph comparing the deposition rates of tungsten, as a function of substrate temperature, on substrates produced according to the soft argon etch embodiment of the present invention, on silicon substrates, on vacuum transferred TiN substrates and on air-exposed TiN substrates.

The temperature sensitivity of tungsten nucleation on titanium nitride (TiN) with a hydrogen reduction process has been found to be problematic at temperatures of approximately 450° C. and below. For example, at temperatures of 435° C. and below, the time-averaged deposition rate on air-exposed TiN falls dramatically, as illustrated in FIG. 1 by data points 11 and approximated by curve 10. This figure illustrates this temperature dependence as a plot of the log of the deposition rate versus the reciprocal of the temperature in degrees Kelvin. The slope of such a curve is proportional to a characteristic "activation energy" ($E_a$) for a chemical process or reaction.

In comparison, the deposition rates for the chemical vapor deposition of tungsten onto silicon substrates exhibit a better behaved temperature dependence. Tungsten deposition rates onto a silicon wafer, coated in the same manner as the TiN wafer discussed above, are represented by the diamond-shaped data points of 12, which are approximated by curve 18 in FIG. 1.

One indication of the onset of the poor nucleation of tungsten onto a TiN surface is a very large variation of film thickness across the TiN surface of a wafer. As reported by M. Iwasaki et al. in *Tungsten and Other Refractory Metals for VLSI/ULSI Applications*, Vol V, page 187 (S. S. Wong & S. Furakawa, eds., Materials Research Society 1990), film growth appears to begin near the edge of the wafer and progresses toward the center, leaving the film thickness at the edge much larger than near the center. Such film thicknesses are found to vary from 10,000 Å to 500 Å across the surface of a single wafer. This phenomenon reduces the average film thickness on the wafer, requiring extended deposition time to assure that the entire wafer receives a coating of the minimum desired thickness.

The CVD methods of the present invention can be performed in various CVD reactors that those skilled in the art would select for the application of films on semiconductor wafers. Such reactors include cold wall CVD reactors, hot wall CVD reactors, plasma enhanced CVD reactors and rotating susceptor CVD reactors. Preferably, the CVD reactor used with the present invention is of the type described in U.S. Pat. No. 5,370,729, and the deposition process for the blanket tungsten is that described in U.S. Pat. No. 5,434,110, both assigned to the assignee of the present application and both expressly incorporated by reference herein. The substrates coated with tungsten in the samples to which the data set forth below relates were prepared in such an apparatus by such a process.

Figure 2:
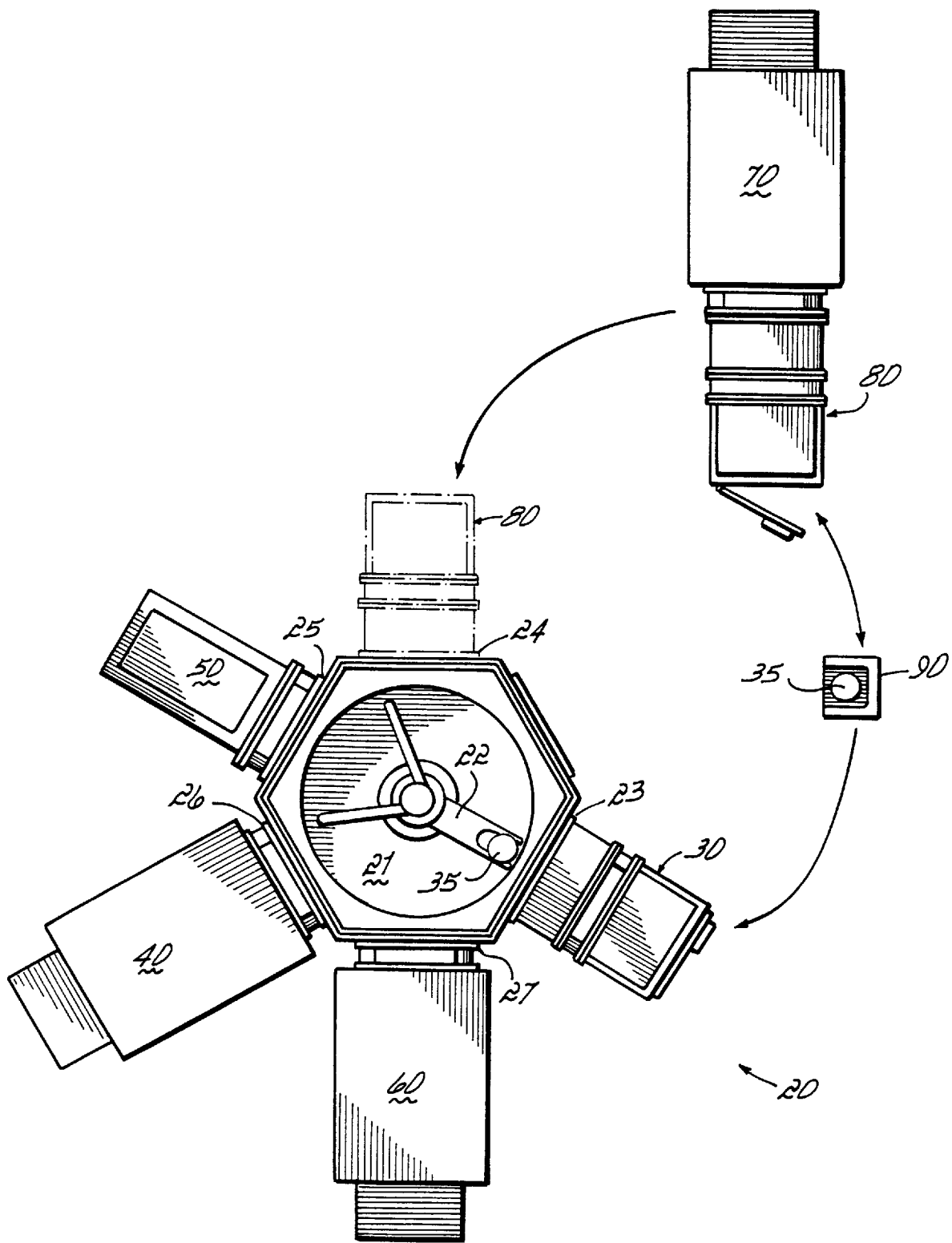
FIG. 2 is a diagrammatic representation of a CVD processing apparatus for performing a method according to one embodiment of the present invention.

Apparatus for performing the processes discussed herein may take the forms illustrated in FIG. 2, which shows a CVD reactor equipped cluster tool 20. The cluster tool 20, for example, may include a transfer chamber 21 that includes a wafer handling robot arm 22 and a plurality of peripheral wafer passage ports 23–27. One of these ports, port 23 is connected to a cassette load lock module 30 of a conventional type, through which wafers 35, coated with blanket tungsten film, are entered from atmosphere. The port 26 is connected to tungsten CVD reactor module 40 of the type described in U.S. Pat. No. 5,370,729 discussed above. Port 25 is connected to a soft etch module 50. Optionally, a TiN coating module, which may, in one embodiment be a TiN CVD module and in another embodiment be a TiN reactive sputter coating module, is connected to port 27. Port 24 is made available for the removable connection of a second cassette module by which wafers may be entered to the tool 20 through a vacuum, inert or ambient pressure oxygen free atmosphere. Alternatively, any of a number of additional modules may be connected to port 24 or to a second transfer module connected to port 24.

The transfer chamber 21 contains argon or another inert gas maintained at a vacuum. In the tests that provided the data discussed herein in connection with FIG. 1, wafers were each entered into the vacuum through the load lock module 30 and transferred through the transfer chamber 21 by the transfer arm 22 to and among the various other modules of the tool 20. In the coating of the wafers that are responsible for the data points 11 that conform to curve 10 in FIG. 1, TiN coated wafers were loaded from ambient clean room atmosphere containing oxygen into the cassette load lock module 30, then transferred by the transfer arm 21 to the CVD module 40 where they were coated with blanket tungsten.

FIG. 1 also illustrates the rate of tungsten CVD onto TiN coated wafers that have been maintained in an inert vacuum environment, with no atmospheric or oxygen contact, from the time that clean TiN surfaces of the wafers were created until their introduction into the tungsten CVD reactor chamber. Tungsten CVD rates on these protected wafers is represented by triangular data points 13. The data represented by points 13 were obtained by introducing silicon wafers into the cassette module 30 and from there into the TiN coating module 60, which for the initial test was a CVD module configured for the CVD of TiN. In the module 60, a film of TiN was applied to the silicon wafers to form the TiN substrate surfaces. Then, the TiN coated wafers were transferred from the TiN coating module 60 into the tungsten CVD module 40 where the blanket tungsten coating was applied. The wafers were maintained in the oxygen free vacuum environment of the transfer module 21 from the time they were removed from the module 60 in which the TiN coating was applied until sealed in the module in which the tungsten deposition operation was carried out, thus protecting them from effects of ambient atmosphere. The resulting data points 13, as with the data points 12, conform approximately to the curve 18, showing a typical temperature dependence with nucleation comparable to that onto uncoated silicon. Furthermore, subsequent testing has, however, demonstrated that this method produces rapid nucleation less reliably at wafer temperatures below 435° C. than do methods of the present invention discussed below, which more reliably enhance nucleation under such conditions.

According to one preferred embodiment of the present invention, TiN coated substrate wafers are introduced from atmosphere through the cassette module 30, from which they are transferred by arm 22 into sputter etch module 50 where they were subjected to a soft argon sputter etch. This etching cleans the surface by a measurable removal of material from the surface of the wafer. These sputter cleaned wafers are then transferred into the CVD module 40 where a blanket tungsten film is applied. The deposition rate of the tungsten deposited in tests of such process has resulted in the generation of data represented by the solid circular data points 14 of FIG. 1. These data points also conform approximately to the curve 18, and demonstrate a temperature dependence that is not degraded as was the case with curve 10 for the uncleaned TiN wafers that had been exposed to air.

In tests of the process of subjecting the TiN wafers to the soft etch before performing the tungsten coating operation, the TiN film was applied in module 60 of the tool 20, with module 60 being a module configured for CVD of the TiN. The TiN coated wafers were then removed from the tool 20 and exposed to a clean atmosphere containing oxygen so that they were identical to the wafers that were used in the test responsible for the data 11 that conformed to the degraded temperature dependent curve 10. Then the wafers were reintroduced into the tool 20, soft etched in the sputter etch module 50, then transferred through an oxygen free vacuum atmosphere of the transfer module 21 to the tungsten CVD module 40 where the blanket tungsten coating was applied. The resulting data points 14 show the absence of the effects that may be due to the oxygen exposure and that degraded the data of curve 10 for the uncleaned oxygen exposed TiN wafers. The data 14 correspond more closely to curve 18 to which the date points 12 and 13 conform.

In order to assure the validity of the data for the comparison of the processes represented by data points 11 through 14, comparable conditions were used. In the coating of the silicon wafers, the wafers were introduced from the oxygen containing atmosphere outside of the loadlock 30 into the tool 20 and then directly into the CVD module 40 for direct tungsten CVD coating. Curve 18 illustrates the straight-forward temperature dependence of the deposition reaction onto air exposed silicon, which dramatizes the exaggerated temperature dependence seen in curve 10 for deposition onto the uncleaned air exposed TiN wafers.

In order to control the samples for comparison of the data of tungsten CVD onto the various TiN substrates, all of the TiN substrates were first prepared in the form of silicon wafers coated by TiN CVD in the module 60. Such a module may be the same or similar to that of the tungsten CVD module 40, except configured for TiN CVD. For example, titanium nitride films were deposited on three separate sets of silicon substrates using conventional CVD techniques that involved loading each silicon wafer into a CVD reaction chamber and flowing $TiCl_4$ and $NH_3$ gases into the chamber. The $TiCl_4$ and $NH_3$ gases were caused to pass over each silicon wafer and react to deposit a TiN film upon the exposed surface of each silicon wafer.

The air-exposed TiN substrates, represented by the square-shaped data points 11 that follow curve 10 in FIG. 1, were prepared by exposing TiN substrates to atmospheric conditions, in oxygen containing air at standard temperature and pressure. After these substrates were prepared, tungsten was deposited by CVD on each substrate using a conventional $WF_6$ reduction process in a reaction chamber at 80 Torr of pressure. Tungsten deposition occurred by flowing $H_2$ gas at a rate of about 2000 cc/min and $WF_6$ at a rate of about 300 cc/min. One of ordinary skill in the art will appreciate that the pressure and flow rates may be varied. The wafers of this set were coated with tungsten at different temperatures, resulting in the data points 11 of curve 10, which shows the deposition rates of tungsten dropping by about 90 percent as the temperature is decreased from 450° to 425° C.

The second set of TiN substrates was prepared in a dual chamber plasma enhanced CVD reactor, also by passing $TiCl_4$ and $NH_3$ gases over a silicon wafer, as described above. However, rather than being subjected to the atmosphere after the forming of the TiN film, the substrates were directly transferred under a vacuum atmosphere to a tungsten CVD chamber in the same processing tool, where the tungsten film was applied as above. The deposition rates resulting are represented by the set of data points 13 in FIG. 1. As the data points 13 illustrate, without the exposure to atmosphere, the deposition rate fall off is close to curve 18 that corresponds to the data points 12 for the silicon wafer, and not to the dramatic deposition rate fall off with declining temperature shown by curve 10 for the air exposed TiN coated wafer. Furthermore, subsequent testing has demonstrated that this method produces rapid nucleation even more reliably at wafer temperatures below 435° C. than does the method that produced the data points 12.

The set of TiN substrates for soft etching according to principles of the present invention were also created by coating silicon wafers in the TiN CVD module 60, as with the TiN wafers discussed above for data 12 and 13. These wafers were then removed from the tool 20 and exposed to atmosphere in the same manner, under the same conditions and for the same amounts of time as the wafers responsible for data 11 of curve 10. However, upon introduction into the cluster tool containing the tungsten CVD reactor, the wafers were individually transferred by the transfer arm 21 into the soft etch module 50 and there subjected to a soft argon plasma etch. The sputter etching module 50 is preferably of the type disclosed in the commonly assigned U.S. Pat. No.

5,391,281 and in the commonly assigned and copending U.S. Pat. application Ser. No. 08/410,362 entitled SPUTTER ETCHING APPARATUS WITH PLASMA SOURCE HAVING A DIELECTRIC POCKET AND CONTOURED PLASMA SOURCE, invented by Ghanbari, filed on Mar. 24, 1995, both of which are expressly incorporated herein by reference. The plasma or sputter etching techniques of the present invention can be performed using a variety of sputter etching equipment which those skilled in the art would select, including inductively coupled sputter etching equipment. Following the sputter etching step, the wafers were transferred from the soft etch chamber 50 into the tungsten CVD chamber 40 by the transfer arm 22. In the CVD chamber 40 a blanket tungsten coating is applied as with the other samples described above to produce the circle-shaped data points 14 in FIG. 1.

Figure 3:
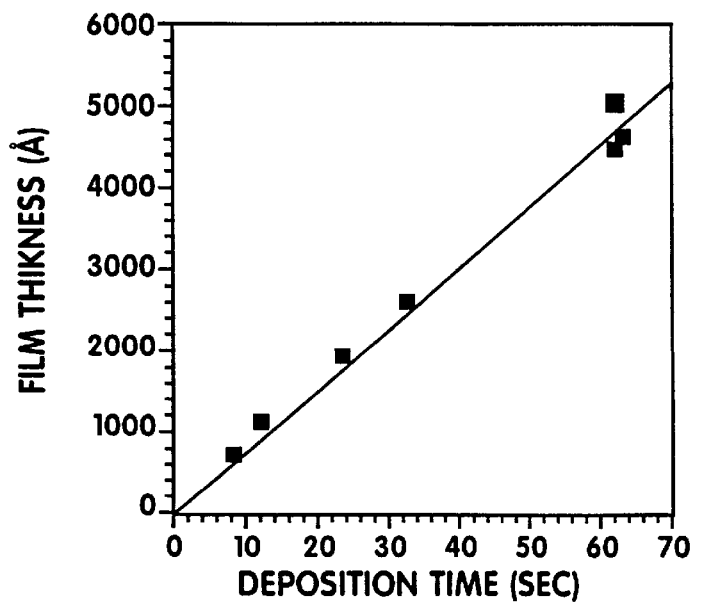
FIG. 3 is a graph illustrating rate of tungsten deposition with a substrate processed according to the preferred embodiment of the present invention.

The tungsten deposition rates onto the soft etched air exposed TiN coated substrates (data points 14), according to this embodiment of the invention, are at least as good as the rates onto silicon substrates (data points 12) or onto TiN substrates that have not been exposed to atmosphere (data points 13). Further, the deposition rates, represented by points 14, according to the present invention, are substantially better at temperatures below 450° C. than the rates onto the substrates exposed to air without the sputter etching of the surface (curve 10). The deposition rate of tungsten onto the soft etched substrates is further represented by the graph of FIG. 3 illustrating the tungsten film thickness, in Angstrom units (Å) plotted directly as a function of deposition time in seconds. The data plotted in this figure is that of the deposition rates for a CVD reaction carried out at 80 torr, with 175 sccm of $WF_6$, 2,000 sccm of $H_2$, with a substrate temperature of 400° C. and on a susceptor rotating at 1,500 rpm, where sccm refers to cubic centimeters per minute of gas at standard temperature and pressure.

In FIG. 1, the data points corresponding to deposition on air-exposed TiN at temperatures below 450° C. of curve 10 do not fit the same line as the data at higher temperatures. The data suggests that the time-averaged growth rate is limited by the initial nucleation of the film. In other words, at temperatures below 450° C., the slow initial nucleation period on the air-exposed TiN inhibits the growth rate of the tungsten film. Deposition on silicon, onto unexposed TiN and onto the soft etched air exposed TiN as represented by curve 18 does not show the same characteristic behavior.

The sputter etching process is believed to remove the oxidized surface layer on the TiN-coated substrate. It may also result in a titanium-rich surface layer. As shown in FIG. 1, the deposition rates on the sputter etched TiN film closely follow those for the tungsten deposition onto silicon and onto the vacuum transferred wafers for temperatures as low as 350° C. It is anticipated that the same response occurs at even lower temperatures.

Contrary to the results achieved by prior researchers, it appears that the hydrogen reduction of $WF_6$ may occur readily on air-exposed TiN below 450° C. where the surface has been exposed to oxygen, provided that the surface is plasma treated and substantially free of the adverse effects of an oxidized layer. Thus, this suggests that a TiN surface that is substantially free of the adverse effects of an oxidized layer better allows for rapid nucleation of tungsten during tungsten CVD, and causes the tungsten deposition process to begin promptly upon introduction of the $H_2$ and $WF_6$ reactant gases. Other resulting changes in the characteristics of the surface layer may aid the nucleation, which may overcome the adverse effects of oxygen by providing compensating advantages. For example, a titanium rich surface, with Ti in the zero-valence or "metallic" state, may be produced and may be beneficial to rapid nucleation of tungsten and to film growth during tungsten CVD. This may result in nucleation of the tungsten that is as good as it would have been in the absence of oxygen, notwithstanding that oxygen may remain to some degree on the surface.

The process of the present invention demonstrates that hydrogen reduction of $WF_6$ on an air-exposed TiN substrate at temperatures as low as 350° C. and lower, can occur at rates comparable to deposition rates on silicon substrates and on TiN substrates that have been protected from the atmosphere. The tungsten CVD rate on air-exposed TiN substrates processed in accordance with the principles of the present invention at temperatures below 450° C. represents a substantial improvement over the deposition rates previously observed on air-exposed TiN substrates at comparable temperatures.

Figure 4:
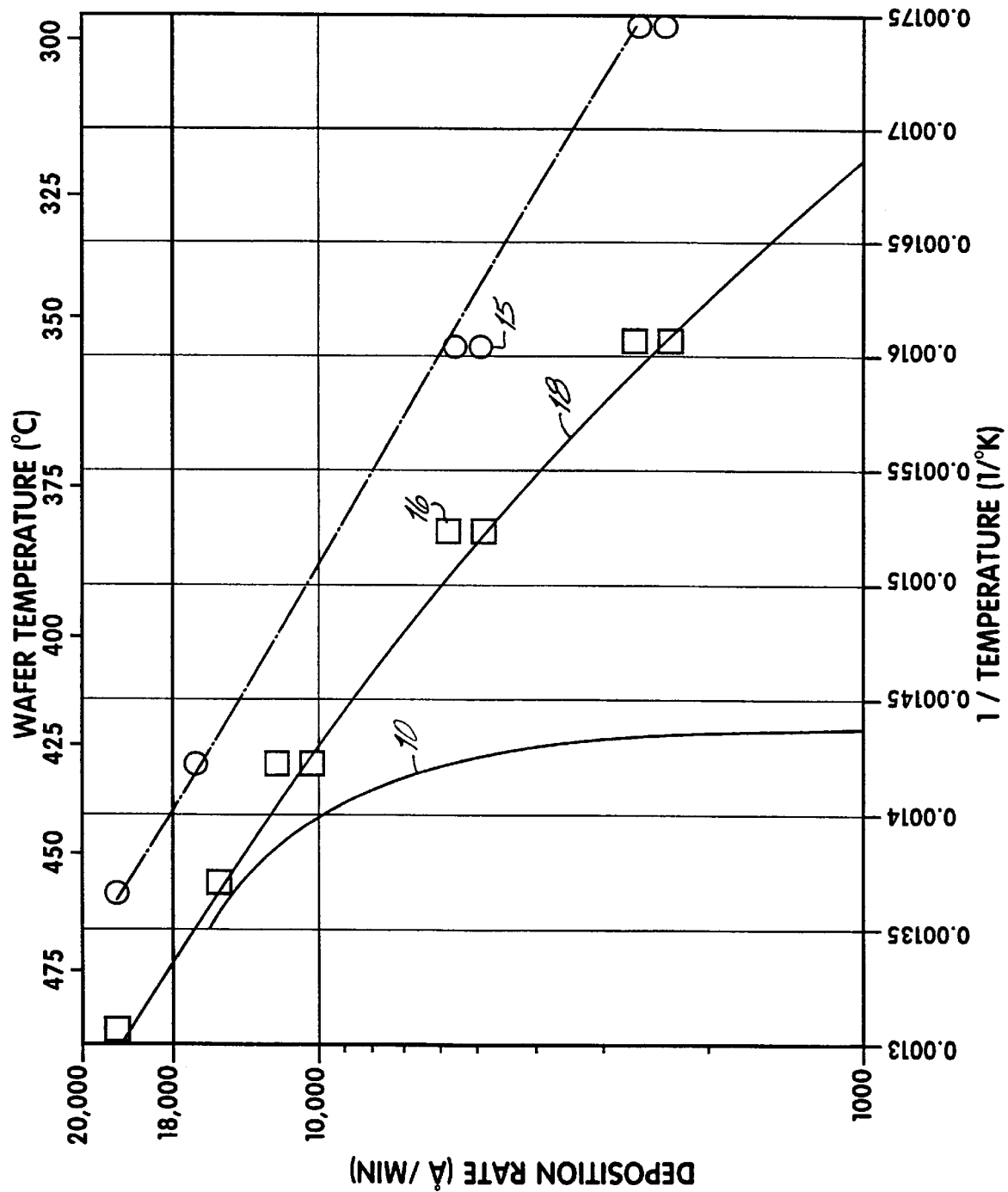
FIG. 4 is a graph similar to FIG. 1 and further compares deposition rates of the tungsten according to hydrogen plasma etch embodiments of the present invention.

In FIG. 4, the deposition rate according to a further embodiment of the invention is represented by the hollow circular data points 15. The data points represent the CVD rate of tungsten onto air exposed TiN wafers, prepared as described above, with plasma treatment with a plasma formed of a hydrogen gas within the chamber of the CVD module 40 of the apparatus 20 of FIG. 2 prior to the tungsten CVD operation. This hydrogen plasma treating process was carried out on a TiN sputter coated wafer that was exposed to oxygen containing air in the same way as was the substrate that resulted in the data of curves 11 and 14 in FIG. 1. Referring again to FIG. 2, such wafers were introduced into the cluster tool 20 through the loadlock cassette module 30 and through the transfer module 21 directly into the tungsten CVD module 40. In the module 40, before the flow of the reactant gas containing $WF_6$ into the chamber, hydrogen gas was introduced at a flow rate of 2,000 sccm and at a pressure of 5 torr, with the wafers at temperatures of between 300 and 450° C. A circular parallel plate electrode (not shown) having a diameter of 25 cm was maintained over the substrate at a distance of 20 mm therefrom and energized with 500 watts of RF power at a frequency of 450 kHz. Etch times of up to one minute and to less than ten seconds were found to be adequate.

The wafers treated by the hydrogen plasma were then each immediately subjected to a CVD of tungsten as with the wafers above. In the primary tests, the tungsten was deposited with the reaction pressure maintained at 150 torr. and the data shown by points 15 of FIG. 4 resulted. The points 15 possesses the same characteristics as the data points 12 (and points 13 and 14 of FIG. 1), including, particularly, the same temperature dependence as the curve 18. The overall deposition rate is higher than curve 18 reflects because the pressure for the reaction represented by the data points 15 is higher than the 80 torr pressure of the other curves. Normalization of the data points 15, according to the known pressure dependence relationship of the deposition rate, results in normalized data points 16, which correspond as closely to curve 18 as do the data points 12–14 in FIG. 1. It can be seen that, with the process represented by curves 15 and 16, the hydrogen plasma treating process overcomes the exaggerated temperature dependence possessed by curve 10 for uncleaned oxygen exposed TiN substrate. The processes that produce data points 15 and 16, result from a very low energy plasma that is capable of being produced within the CVD chamber 40 itself with relatively simple and inexpensive plasma generating hardware, thus eliminating the effects of air exposure without the additional soft etch module 50.

The hydrogen plasma treating embodiment of the process of the invention gives more uniform tungsten coatings and that the stability improved markedly, even over other processing techniques that gave rapid nucleation without precleaning. Such a hydrogen precleaning process is believed to be due at least in part to the ability of the hydrogen plasma treatment to reduce hydrocarbons on the TiN surface and to convert at least some of the surface titanium from TiN to a metallic titanium state.

The use of reactive sputter coated TiN in place of CVD TiN in the above examples produces the same comparative results for the various data 11–16. The present invention is particularly useful in facilitating the nucleation of tungsten onto reactive sputter coated TiN. For example, as further illustrated in FIG. 2, the provision for a separate sputter coating apparatus 70 for application of a reactive sputter coated TiN film on the wafers may be employed. Such wafers may then be removed through a load-lock cassette module 80 on a cassette 90 and maintained for a time in an oxygen containing environment. This is typical of a layout where a tool dedicated to sputter coating technology, such as apparatus 70 is maintained in a facility at a point somewhat remote from the location of tool 20, which is primarily provided for CVD technology. The cassette 90 may be then loaded with the TiN sputter coated wafers into the cassette module 30 of the cluster tool 20, where they can be tungsten coated by the process in which the wafers are first soft etched in the module 50 and then transferred under vacuum by arm 22 to the CVD module 40 where they are blanket tungsten coated, producing deposition of tungsten corresponding to the data of curve 14.

By leaving the TiN coated wafers sealed in the cassette module 80, either at a vacuum or in an ambient temperature argon or nitrogen environment, the cassette module 30 may be transferred to and connected to port 24 of the tool 20. Such wafers may be transferred from the cassette module 80 directly into the tungsten CVD module 40 for blanket coating with tungsten, producing results corresponding to the process that produced data points 13. The sputter deposition of TiN, like the argon soft etch and hydrogen etch steps described above, can produce a film that has some component of elemental titanium. Thus, maintaining such a surface in an environment free of oxygen between the plasma coating, etching or hydrogen treating process until the performance of the tungsten CVD operation is believed to enhance or accelerate the nucleation of the tungsten.

The above disclosure provides the general principles of the present invention and specific details thereof. Persons skilled in the art will readily understand that the invention is not limited thereby, however, and that various alternatives will be apparent to such persons. For example, one of ordinary skill in the art will recognize that various modifications may be made to the methods employed to etch or clean the air-exposed TiN substrate to remove the oxide layer prior to the CVD of tungsten. Additionally, the process of the present invention may be utilized to sputter etch air-exposed TiN films produced by various methods, including physical vapor deposition, conventional CVD methods, reactively sputtered TiN and rapid thermal process TiN. Accordingly, it is to be understood that changes may be made without departing from the scope of the invention.

Therefore, the following is claimed:

1. A method of accelerating the nucleation of tungsten, without the use of silane, during the chemical vapor deposition of the tungsten onto an air-exposed TIN surface of a substrate in a CVD apparatus having at least one process chamber, the method comprising the steps of:

plasma etching the air-exposed TiN surface of the substrate; and without substantially exposing the plasma etched surface to an oxygen containing environment, injecting $H_2$ and $WF_6$ into a CVD process chamber having the substrate mounted therein while maintaining conditions to produce a reduction reaction resulting in tungsten deposition onto the TiN surface of the substrate.

2. The method of claim 1 wherein:

the plasma etching step includes the step of sputter etching the TiN surface of the substrate to remove the portion thereof.

3. The method of claim 2 wherein:

the sputter etching is carried out in a separate sputter etching chamber that is selectively connectable through a substantially oxygen free environment with the CVD process chamber.

4. The method of claim 3 further comprising the step of:

transferring the substrate from the sputter etch chamber to the CVD process chamber exclusively through the substantially oxygen free environment following the etching step and prior to the injecting step.

5. The method of claim 2 wherein:

the sputter etching is carried out in the CVD process chamber prior to deposition of the tungsten onto the surface of the substrate.

6. The method of claim 1 wherein the TiN surface of the substrate is selected from the group consisting of films deposited on the substrate by physical vapor deposition TiN, by CVD TiN, by reactively sputtered TiN, by rapid thermal process TiN or by plasma enhanced CVD TiN.

7. The method of claim 1 wherein the condition maintaining step comprises the step of:

maintaining the substrate temperature during the reduction reaction at less than 500° C. and above 200° C.

8. The method of claim 1 wherein:

the plasma etching step includes the step of soft sputter etching the TiN surface of the substrate to clean the TiN surface.

9. A method of applying a tungsten film onto a TiN surface of a substrate in a CVD apparatus without the use of silane, the method comprising the steps of:

in a processing chamber, plasma cleaning a substrate having a TiN surface to remove oxygen from the TiN surface; then transferring the substrate through a substantially oxygen free environment into a CVD process chamber; and then injecting $H_2$ and $WF_6$ into the CVD process chamber and onto the surface of the substrate while maintaining conditions to produce a reduction reaction resulting in tungsten deposition onto the TiN surface.

10. The method of claim 9 wherein:

the plasma cleaning step includes a process of soft sputter etching a TiN surface of the substrate to remove oxygen from the TiN surface of the substrate and to produce a Ti rich surface layer on the TiN surface of the substrate.

11. The method of claim 9 wherein the condition maintaining step includes the step of:

maintaining the substrate temperature during the reduction reaction at less than 500° C. and at above 200° C.

12. The method of claim 9 wherein:

the plasma cleaning step includes a process of sputter etching a TiN surface of the substrate to produce the substantially oxygen free TiN surface on the substrate.

13. The method of claim 12 wherein the TiN surface is selected from the group consisting of physical vapor deposition TiN, CVD TiN, reactively sputtered TiN, rapid thermal process TiN or plasma enhanced CVD TiN.

14. A method of accelerating the nucleation and deposition rate of tungsten, without the use of silane, during the chemical vapor deposition of the tungsten onto an air-exposed TiN surface of a silicon wafer substrate in a CVD apparatus having at least one process chamber, the method comprising the steps of:

plasma etching the air-exposed TiN surface of the substrate and thereby removing oxygen therefrom and creating a Ti rich surface layer on the TiN surface of the substrate; and without substantially further exposing the plasma etched surface of the substrate to an oxygen containing environment, injecting $H_2$ and $WF_6$ into a CVD process chamber having the substrate mounted therein while maintaining the temperature of the surface of the substrate at not less than 200° C. and not more than approximately 400° C. to produce a reduction reaction resulting in tungsten deposition onto the TiN surface of the substrate.

15. The method of claim 14 wherein:

the plasma etching is carried out in the CVD process chamber prior to deposition of the tungsten onto the surface of the substrate.

16. The method of claim 14 further comprising the steps of:

performing the plasma etching step in a sputter etch chamber that is separate from the CVD process chamber; and transferring the substrate from the sputter etch chamber to the CVD process chamber exclusively through the substantially oxygen free environment following the etching step and prior to the injecting step.

17. The method of claim 14 wherein:

the plasma etching is a soft sputter etching step performed on the TiN surface of the substrate.

* * * * *

UNITED STATES PATENT AND TRADEMARK OFFICE
CERTIFICATE OF CORRECTION

PATENT NO. : 5,906,866
DATED : May 25, 1999
INVENTOR(S) : Douglas A. Webb

It is certified that error appears in the above-indentified patent and that said Letters Patent is hereby corrected as shown below:

Column 7, line 63, reads "date points" and should read --data points--.

Column 8, line 18 reads "TiCI$_4$" and should read --TiCl$_4$-- as appears in the Column 8, line 39 reads "TiCI$_4$" and should read --TiCl$_4$-- as appears in the Claim 1, line 3 reads "TIN" and should read --TiN-- as appears in the Signed and Sealed this

Eleventh Day of January, 2000

Attest:

Q. TODD DICKINSON

*Attesting Officer*     *Acting Commissioner of Patents and Trademarks*